United States Patent
Tseng et al.

(10) Patent No.: US 8,008,769 B2
(45) Date of Patent: Aug. 30, 2011

(54) HEAT-DISSIPATING SEMICONDUCTOR PACKAGE STRUCTURE AND METHOD FOR MANUFACTURING THE SAME

(75) Inventors: Wen-Tsung Tseng, Taichung (TW); Ho-Yi Tsai, Taichung Hsien (TW); Chien-Ping Huang, Taichung (TW); Cheng-Hsu Hsiao, Nantou (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 261 days.

(21) Appl. No.: 12/150,047

(22) Filed: Apr. 23, 2008

(65) Prior Publication Data
US 2008/0258294 A1  Oct. 23, 2008

(30) Foreign Application Priority Data
Apr. 23, 2007 (TW) .............................. 96114195 A

(51) Int. Cl.
*H01L 23/34* (2006.01)
(52) U.S. Cl. ............... 257/718; 257/720; 257/E21.502
(58) Field of Classification Search .................. 257/718, 257/685, 706, 712, 717, 720, 787, 796, E21.502
See application file for complete search history.

(56) References Cited

U.S. PATENT DOCUMENTS

| 6,369,455 B1 * | 4/2002 | Ho et al. | ...................... 257/796 |
| 6,798,054 B1 | 9/2004 | Lo et al. | |

* cited by examiner

*Primary Examiner* — Jack Chen
(74) *Attorney, Agent, or Firm* — Peter F. Corless; Steven M. Jensen; Edwards Angell Palmer & Dodge LLP

(57) ABSTRACT

A heat-dissipating semiconductor package structure and a method for manufacturing the same is disclosed. The method includes: disposing on and electrically connecting to a chip carrier at least a semiconductor chip and a package unit; disposing on the top surface of the package unit a heat-dissipating element having a flat portion and a supporting portion via the flat portion; receiving the package unit and semiconductor chip in a receiving space formed by the flat portion and supporting portion of the heat-dissipating element; and forming on the chip carrier encapsulant for encapsulating the package unit, semiconductor chip, and heat-dissipating element. The heat-dissipating element dissipates heat generated by the package unit, provides EMI shielding, prevents delamination between the package unit and the encapsulant, decreases thermal resistance, and prevents cracking.

10 Claims, 4 Drawing Sheets

HEAT-DISSIPATING SEMICONDUCTOR PACKAGE STRUCTURE AND METHOD FOR MANUFACTURING THE SAME

BACKGROUND OF THE INVENTION

1. Field of the Invention

The present invention relates generally to a heat-dissipating semiconductor package structure and method for manufacturing the same, and more particularly to a semiconductor package structure that can efficiently dissipate heat of multi-package structure and method for manufacturing the same.

2. Description of Related Art

Along with development of electronic products in a direction of multi-function, high electricity and high operation speed, R&D effort in semiconductor industries has focused on semiconductor devices integrating a plurality of chips or packages.

Compared with a multi-chip package that integrates a plurality of semiconductor chips in a single package, U.S. Pat. No. 6,798,054 discloses a package in package (PIP) structure, wherein a package 11 having passed the electrical test is integrated in another package 12, as shown in FIG. 1. Such a structure can overcome the problem of known good die (KGD) in conventional multi-chip packages.

However, for a chip of a package integrated into another package, heat generated by the chip during operation is difficult to dissipate as several layer encapsulant made of mold compound of low heat-dissipating coefficient encloses the chip, which can lead to malfunction of the internal package and even lead to malfunction of adjacent electronic components or semiconductor chips.

Further, referring to FIG. 2, as disclosed by Taiwan Patent No. I239058, the mold compound of the package structure comprises a certain proportion of mold release agent such as wax for facilitating mold release after a package molding process. However, the mold release agent is easy to be attached to surface of the package 21 and makes it difficult for the package 21 to be combined with the mold compound of the external package 22, which thus leads to a delamination problem, increases heat resistance and even leads to cracking of the external package 22. To overcome the above-described problems, concave portions or roughening structure 210 are formed on surface of the package 21, which however increases the manufacturing cost and complicating the manufacturing process.

Therefore, there is a need to provide a heat-dissipating semiconductor package structure and method for manufacturing the same, through which a package integrated into another package can efficiently dissipate heat and such conventional problems as package malfunction, delamination, increased heat resistance and cracking of external package can be prevented.

SUMMARY OF THE INVENTION

According to the above drawbacks, an objective of the present invention is to provide a heat-dissipating semiconductor package structure and method for manufacturing the same, through which a package integrated into another package can efficiently dissipate heat.

Another objective of the present invention is to provide a heat-dissipating semiconductor package structure and method for manufacturing the same, through which package malfunction can be prevented.

A further objective of the present invention is to provide a heat-dissipating semiconductor package structure and method for manufacturing the same, through which cracking of an external package can be prevented.

Still another objective of the present invention is to provide a heat-dissipating semiconductor package and method for manufacturing the same, which can save manufacturing cost and simplifying manufacturing process by eliminating the need of forming concave portions or roughening structures on an internal package.

In order to attain the above and other objectives, a method for manufacturing a heat-dissipating semiconductor package structure is disclosed, which comprises the steps of: providing a chip carrier and disposing on and electrically connecting to the chip carrier at least a semiconductor chip and at least a completed package unit; providing a heat-dissipating element having a flat portion and disposing the flat portion of the heat-dissipating element on the top surface of the package unit; and performing a package molding process so as to form an encapsulant encapsulating the package unit, the semiconductor chip and the heat-dissipating element, wherein the area of the flat portion of the heat-dissipating element is bigger than that of the top surface of the package unit such that the package unit can be covered by the flat portion of the heat-dissipating element.

The present invention also discloses a heat-dissipating semiconductor package structure, which comprises: a chip carrier; at least a semiconductor chip disposed on and electrically connected to the chip carrier; at least a package unit disposed on and electrically connected to the chip carrier; a heat-dissipating element having a flat portion disposed on the top surface of the package unit, wherein the area of the flat portion is bigger than that of the top surface of the package unit for covering the package unit; and an encapsulant formed on the chip carrier for encapsulating the semiconductor chip, the package unit and the heat-dissipating element.

The heat-dissipating element further comprises a supporting portion extending downward from the flat portion. The supporting portion can be disposed on the chip carrier through an adhesive. The flat portion is disposed on the top surface of the package unit through a heat conducting adhesive, and the semiconductor and the package unit are received in a receiving space formed by the flat portion and the supporting portion of the heat-dissipating element, thereby efficiently dissipating heat generated by the package unit and the semiconductor chip during operation. Further, the supporting portion of the heat-dissipating element can be disposed on the ground portion of the chip carrier through an electric conducting adhesive so as to provide an EMI shielding effect, or disposed on the semiconductor chip through an adhesive conducting heat but not electricity so as to directly dissipate heat of the semiconductor chip. Moreover, the heat-dissipating element can comprise a plurality of supporting portions respectively disposed on the semiconductor chip and the ground portion of the chip carrier for providing an EMI shielding effect and meanwhile directly dissipating heat of the semiconductor chip. Moreover, at least a bending portion is formed at edges of the flat portion of the heat-dissipating element so as to position the heat-dissipating element on the package unit and prevent displacement of the heat-dissipating element.

Therefore, the heat-dissipating semiconductor package structure and method for manufacturing the same according to the present invention mainly comprises: disposing on and electrically connecting to a chip carrier at least a semiconductor chip and at least a completed package unit; disposing on the top surface of the package unit a heat-dissipating element having a flat portion via the flat portion; and forming on the chip carrier encapsulant for encapsulating the package unit, semiconductor chip, and heat-dissipating element. Therein, as the flat portion of the heat-dissipating element is disposed on the top surface of the package unit and has an area bigger than that of the top surface of the package unit, the heat-dissipating effect of the package unit can be improved, Meanwhile, as the top surface of the package unit is not directly contacted with the encapsulant, such problems as delamination, increased heat resistance and cracking of the package structure can be prevented. Further, the heat-dissipating element comprises a supporting portion extending downward from the flat portion. The supporting portion can be disposed on the chip carrier through an adhesive. Moreover, the supporting portion can be disposed on the ground portion of the chip carrier through an electric conducting adhesive so as to provide an EMI shielding effect, or disposed on the semiconductor chip through an adhesive conducting heat but not electricity so as to directly dissipate heat generated by the semiconductor chip. Alternatively, the heat-dissipating element can comprise a plurality of supporting portions respectively disposed on the semiconductor chip and the ground portion of the chip carrier, thereby providing an EMI shielding effect and meanwhile directly dissipating heat generated by the semiconductor chip.

DETAILED DESCRIPTION OF PREFERRED EMBODIMENTS

The following illustrative embodiments are provided to illustrate the disclosure of the present invention, these and other advantages and effects can be apparent to those skilled in the art after reading the disclosure of this specification. The present invention can also be performed or applied by other different embodiments. The details of the specification may be on the basis of different points and applications, and numerous modifications and variations can be made without departing from the spirit of the present invention.

First Embodiment

Figure 1:
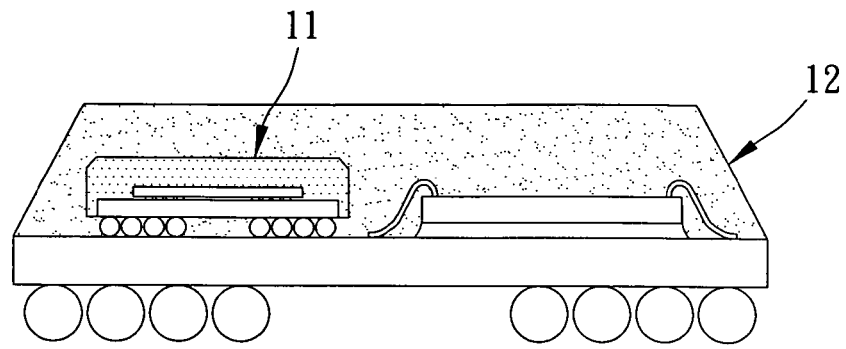
FIG. 1 is a diagram of a PIP structure disclosed by U.S. Pat. No. 6,798,054.
Figure 2:
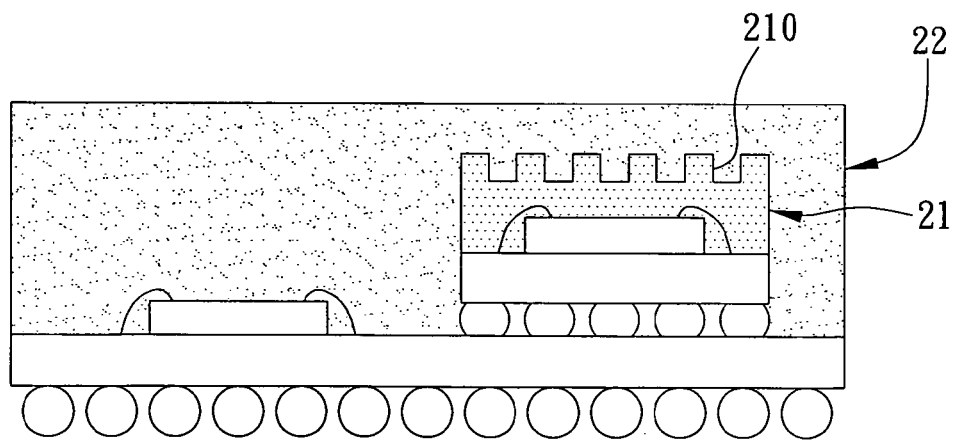
FIG. 2 is a diagram of a semiconductor package structure disclosed by TW Patent 239058B.
Figure 3A:
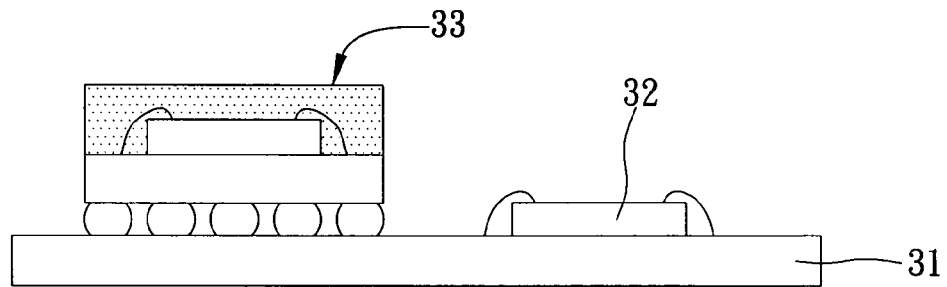
FIG. 3A to 3C are sectional diagrams of a heat-dissipating semiconductor package structure and method for manufacturing the same according to a first embodiment of the present invention.
Figure 3B:
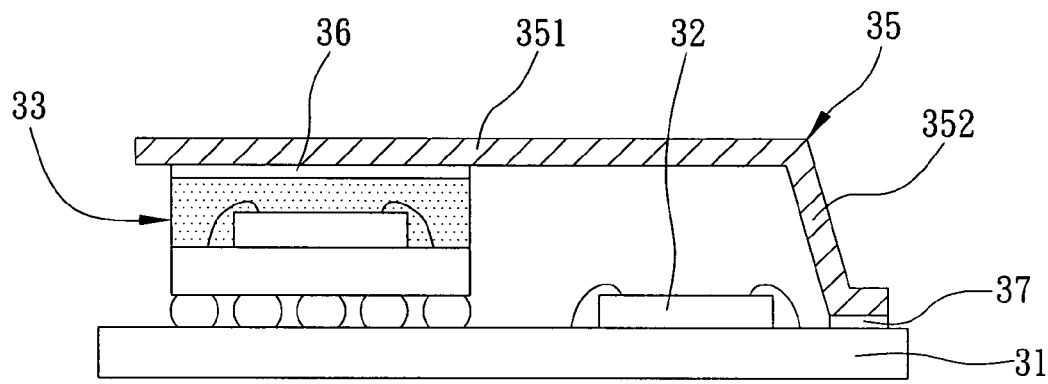
Figure 3C:
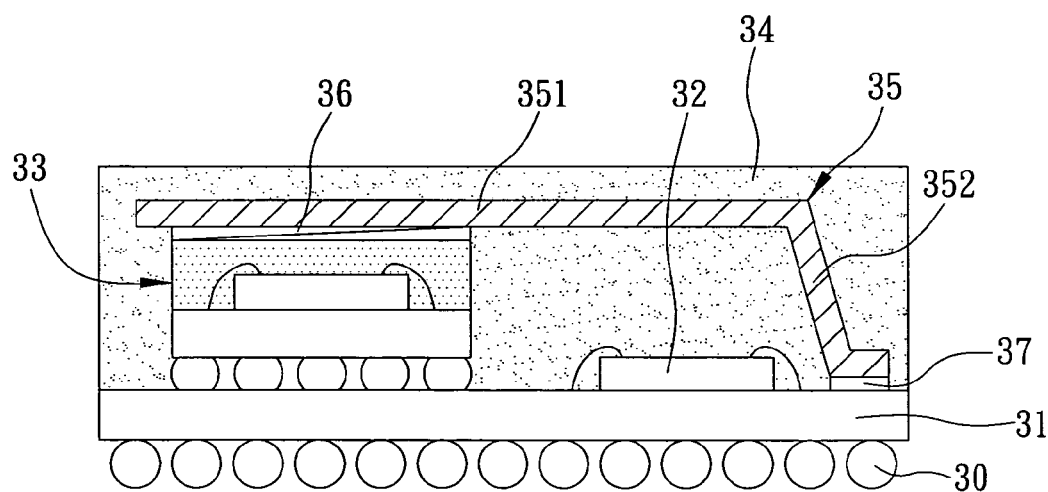

FIGS. 3A to 3C are sectional diagrams showing a heat-dissipating semiconductor package structure and method for manufacturing the same according to a first embodiment of the present invention.

As shown in FIG. 3A, a chip carrier such as a substrate 31 is provided and at least a semiconductor chip 32 and at least a completed package unit 33 are disposed on and electrically connected to the substrate 31.

The chip carrier can be a substrate 31 as shown in the drawing, or can be a leadframe. The semiconductor chip 32 is electrically connected to the substrate through wire bonding as shown in the drawing, or can be flip-chip electrically connected to the substrate. The package unit 33 is a BGA semiconductor package that has been mounted with chip and packaged as shown in the drawing, or can be a leadframe semiconductor package that has been mounted with chip and packaged.

As shown in FIG. 3B, a heat-dissipating element 35 having a flat portion 351 is provided, wherein the flat portion 351 is disposed to the top surface of the package unit 33 and the area of the flat portion 351 is bigger than that of the package unit 33 such that the package unit 33 can be covered by the flat portion 351 of the heat-dissipating element 35.

The heat-dissipating element 35 is a black oxide treated copper foil or an anodized aluminum foil. Meanwhile, the heat-dissipating element 35 comprises a supporting portion 352 extending downward from the flat portion 351. The package unit 33 and the semiconductor chip 32 are received in a receiving space formed by the flat portion 351 and the supporting portion 352 of the heat-dissipating element. The flat portion 351 is disposed on the top surface of the package unit 33 interposed with a heat conducting adhesive 36. The supporting portion 352 is disposed on the substrate 31 through an adhesive 37.

As shown in FIG. 3C, a packaging molding process is performed so as to form an encapsulant 34 encapsulating the package unit 33, the semiconductor chip 32 and the heat-dissipating element 35.

A plurality of solder balls 30 is further disposed on the bottom surface of the substrate 31 for electrically connecting with an external device.

Through the above manufacturing method, the present invention also discloses a heat-dissipating semiconductor package structure, which comprises: a chip carrier such as a substrate 31; at least a semiconductor chip 32 disposed on and electrically connected to the substrate 31; at least a completed package unit 33 disposed on and electrically connected to the substrate 31; a heat-dissipating element 35 having a flat portion 351, wherein the flat portion 351 is disposed on the top surface of the package unit 33, and the flat portion 351 has an area bigger than that of the top surface of the package unit 33 so as to cover the package unit 33; and an encapsulant 34 formed on the chip carrier 31 so as to encapsulate the semiconductor chip 32, the package unit 33 and the heat-dissipating element 35.

The heat-dissipating element 35 further comprises a supporting portion 352 extending downward from the flat portion 351, the supporting portion 352 is disposed on the substrate 31 through an adhesive 37 and the flat portion 351 is disposed on the top surface of the package unit 33 through a heat conducting adhesive 36, and the semiconductor chip 32 and the package unit 33 are received in a receiving space formed by the flat portion 351 and the supporting portion 352, thereby dissipating heat generated by the package unit 33 and the semiconductor chip 32 during operation.

Second Embodiment

Figure 4:
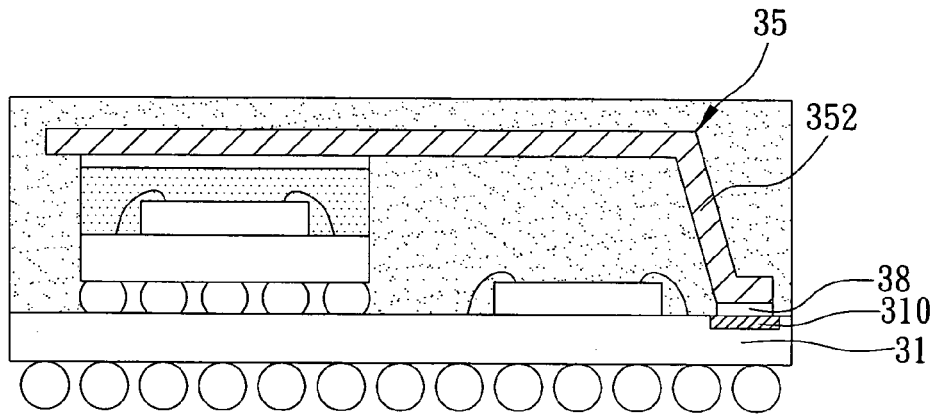
FIG. 4 is a sectional diagram of a heat-dissipating semiconductor package structure according to a second embodiment of the present invention.

Referring to FIG. 4, a heat-dissipating semiconductor package structure according to a second embodiment of the present invention is disclosed, wherein same or similar components in the present embodiment are denoted by same numeral as the above-described embodiment so as to simplify the drawings and ease understanding.

The main difference of the present embodiment from the first embodiment is the supporting portion 352 of the heat-dissipating element 35 is disposed on the ground portion 310 of the substrate 31 through an electric conducting adhesive 38 so as to provide an EMI shielding effect.

Third Embodiment

Figure 5:
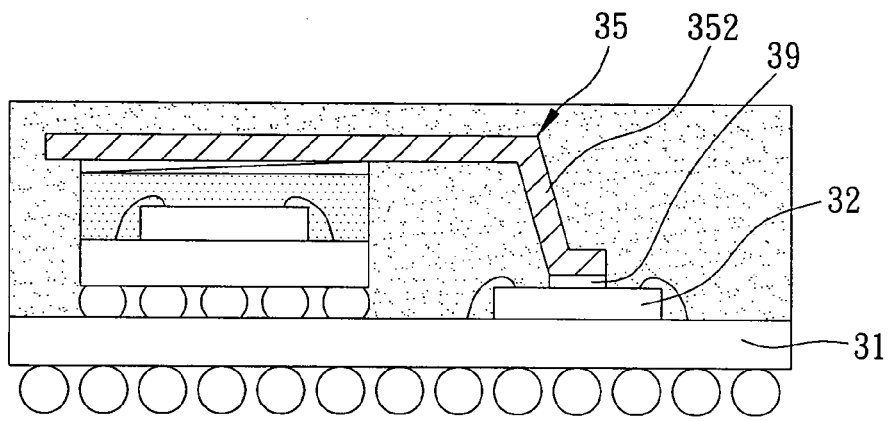
FIG. 5 is a sectional diagram of a heat-dissipating semiconductor package structure according to a third embodiment of the present invention.

Referring to FIG. 5, a heat-dissipating semiconductor package structure according to a third embodiment of the present invention is shown, wherein same or above-described embodiments in the present embodiment are denoted by same numeral as the first embodiment so as to simplify the drawings and ease understanding.

The main difference of the present embodiment from the above-described embodiments is the supporting portion 352 of the heat-dissipating element 35 is disposed on the semiconductor chip 32 through an adhesive 39 conducting heat but not electricity so as to directly dissipate heat generated by the semiconductor chip 32.

Fourth Embodiment

Figure 6:
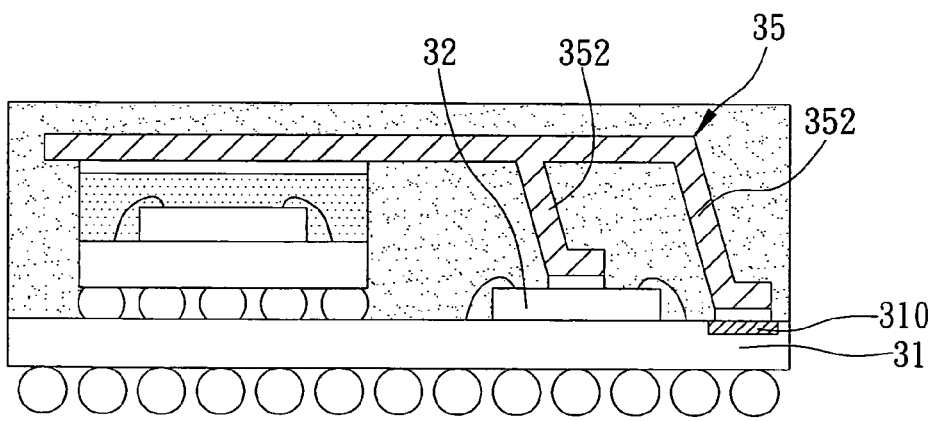
FIG. 6 is a sectional diagram of a heat-dissipating semiconductor package structure according to a fourth embodiment of the present invention.

Referring to FIG. 6, a heat-dissipating semiconductor package structure according to a fourth embodiment of the present invention is shown, wherein same or similar components in the present embodiment are denoted by same numeral as the above-described embodiments embodiment so as to simplify the drawings and ease understanding.

The main difference of the present embodiment from the above-described embodiments is the heat-dissipating element 35 has a plurality of supporting portions 352 which are respectively disposed on the substrate 31 and the semiconductor chip 32 so as to provide an EMI shielding effect and meanwhile directly dissipate heat generated by the semiconductor chip 32.

Fifth Embodiment

Figure 7:
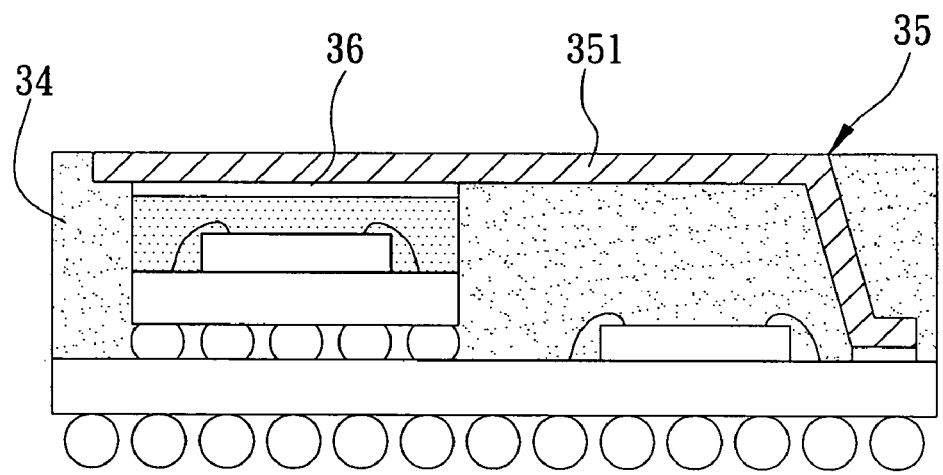
FIG. 7 is a diagram of a heat-dissipating semiconductor package structure according to a fifth embodiment of the present invention.

Referring to FIG. 7, a heat-dissipating semiconductor package structure according to a fifth embodiment of the present invention is shown, wherein same or similar components in the present embodiment are denoted by same numeral as the above-described embodiments so as to simplify the drawings and ease understanding.

The main difference of the present embodiment from the above-described embodiments is the flat portion 351 of the heat-dissipating element 35 is exposed from the encapsulant 34 so as to improve the heat dissipating effect.

Sixth Embodiment

Figure 8:
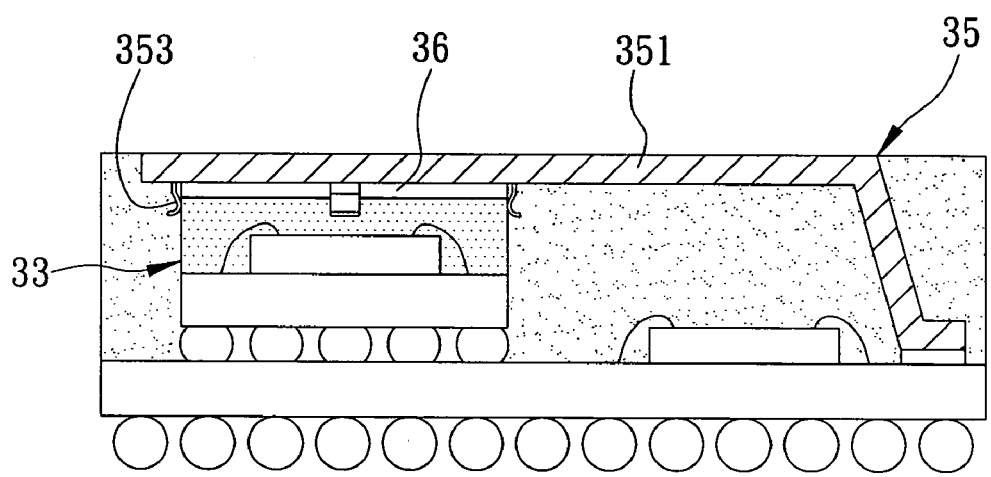
FIGS. 8 and 9 are sectional diagrams of a heat-dissipating semiconductor package structure according to a sixth embodiment of the present invention.
Figure 9:
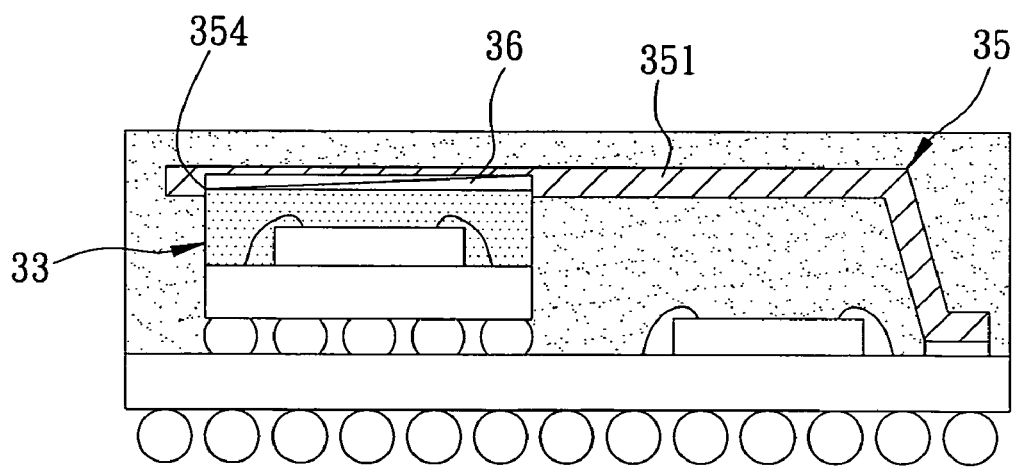

Referring to FIG. 8 and FIG. 9, a heat-dissipating semiconductor package structure according to a sixth embodiment of the present invention is shown, wherein same or similar components in the present embodiment are denoted by same numeral as the above-described embodiments so as to simplify the drawings and ease understanding.

The main difference of the present embodiment from the above-described embodiments is the flat portion 351 of the heat-dissipating element 35 has a positioning portion through which the flat portion 351 can be positioned on the package unit 33. For example, at least a bending portion 353 is formed at edges of the flat portion 351 and bending downward, as shown in FIG. 8, or a groove 354 is formed on the flat portion 351, as shown in FIG. 9, such that when the flat portion 351 of the heat-dissipating element 35 is disposed on the package unit 33 through a heat conducting adhesive 36, the heat-dissipating element 35 can be positioned on the package unit 33 through the positioning portion, thereby preventing displacement of the heat-dissipating element 35.

Therefore, the heat-dissipating semiconductor package structure and method for manufacturing the same according to the present invention mainly comprises: disposing on and electrically connecting to a chip carrier at least a semiconductor chip and at least a completed package unit; disposing on the top surface of the package unit a heat-dissipating element having a flat portion via the flat portion; and forming on the chip carrier encapsulant for encapsulating the package unit, semiconductor chip, and heat-dissipating element. Therein, as the flat portion of the heat-dissipating element is disposed on the top surface of the package unit and has an area bigger than that of the top surface of the package unit, the heat-dissipating effect of the package unit can be improved, Meanwhile, as the top surface of the package unit is not directly contacted with the encapsulant, such problems as delamination, increased heat resistance and cracking of the package structure can be prevented. Further, the heat-dissipating element comprises a supporting portion extending downward from the flat portion. The supporting portion can be disposed on the chip carrier through an adhesive. Moreover, the supporting portion can be disposed on the ground portion of the chip carrier through an electric conducting adhesive so as to provide an EMI shielding effect, or disposed on the semiconductor chip through an adhesive conducting heat but not electricity so as to directly dissipate heat generated by the semiconductor chip. Alternatively, the heat-dissipating element can comprise a plurality of supporting portions respectively disposed on the semiconductor chip and the ground portion of the chip carrier, thereby providing an EMI shielding effect and meanwhile directly dissipating heat generated by the semiconductor chip.

The above-described descriptions of the detailed embodiments are only to illustrate the preferred implementation according to the present invention, and it is not to limit the scope of the present invention, Accordingly, all modifications and variations completed by those with ordinary skill in the art should fall within the scope of present invention defined by the appended claims.

What is claimed is:
1. A heat-dissipating semiconductor package structure, comprising:
   a chip carrier;
   at least a first semiconductor chip disposed on and electrically connected to the chip carrier;
   at least a semiconductor package disposed on and electrically connected to the chip carrier, wherein the semiconductor package has been mounted with at least a second semiconductor chip and packaged;
   a heat-dissipating element having a flat portion disposed on the top surface of the semiconductor package, wherein the area of the flat portion is bigger than that of the top surface of the semiconductor package for covering the semiconductor package; and
   an encapsulant formed on the chip carrier for encapsulating the first semiconductor chip, the semiconductor package and the heat-dissipating element.
2. The structure of claim 1, wherein the heat-dissipating element is one of a black oxide treated copper foil and an anodized aluminum foil.

3. The structure of claim 1, wherein the heat-dissipating element further comprises a supporting portion extending downward from the flat portion such that the semiconductor package and the first semiconductor chip can be received in the receiving space formed by the flat portion and the supporting portion of the heat-dissipating element.

4. The structure of claim 3, wherein the heat-dissipating element is disposed on the top surface of the semiconductor package interposed with a heat conducting adhesive, and the supporting portion is disposed on the chip carrier through an adhesive.

5. The structure of claim 3, wherein the supporting portion of the heat-dissipating element is disposed on the ground portion of the chip carrier through an electrical conducting adhesive.

6. The structure of claim 3, wherein the supporting portion of the heat-dissipating element is disposed on the first semiconductor chip through an adhesive conducting heat but not electricity.

7. The structure of claim 3, wherein the heat-dissipating element has a plurality of supporting portions respectively disposed on the first semiconductor chip and the ground portion of the chip carrier.

8. The structure of claim 1, wherein the flat portion of the heat-dissipating element is exposed from the encapsulant.

9. The structure of claim 1, wherein the flat portion of the heat-dissipating element has a positioning portion for positioning the heat-dissipating element on the semiconductor package.

10. The structure of claim 9, wherein the positioning portion is one of a bending portion formed at edges of the flat portion and bending downward and a groove disposed on the flat portion.

\* \* \* \* \*